United States Patent
Liu et al.

(10) Patent No.: US 12,169,426 B2
(45) Date of Patent: Dec. 17, 2024

(54) ACTIVE HEAT DISSIPATING APPARATUS FOR A TERMINAL, TERMINAL, AND ACTIVE HEAT DISSIPATING METHOD FOR A TERMINAL

(71) Applicant: ZTE CORPORATION, Shenzhen (CN)

(72) Inventors: Yan Liu, Shenzhen (CN); Shaowu Shen, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 306 days.

(21) Appl. No.: 17/628,048

(22) PCT Filed: Aug. 17, 2020

(86) PCT No.: PCT/CN2020/109482
§ 371 (c)(1),
(2) Date: Jan. 18, 2022

(87) PCT Pub. No.: WO2021/093394
PCT Pub. Date: May 20, 2021

(65) Prior Publication Data
US 2022/0261052 A1    Aug. 18, 2022

(30) Foreign Application Priority Data
Nov. 13, 2019 (CN) .......................... 201911108748.2

(51) Int. Cl.
*G06F 1/20*  (2006.01)
*H05K 7/20*  (2006.01)

(52) U.S. Cl.
CPC .............. *G06F 1/206* (2013.01); *G06F 1/203* (2013.01); *H05K 7/20381* (2013.01)

(58) Field of Classification Search
CPC ..... G06F 1/203; G06F 1/206; H05K 7/20381; G05B 19/04
(Continued)

(56) References Cited

U.S. PATENT DOCUMENTS 8,761,956 B2 *  6/2014  Chen ................. H05K 7/20836
                                                361/679.48
2005/0030171 A1 *  2/2005  Liu ......................... G06F 1/206
                                                340/500

(Continued)

FOREIGN PATENT DOCUMENTS

CN      102761666 A     10/2012
CN      104423403 A      3/2015

(Continued)

OTHER PUBLICATIONS

Extended European Search Report of Application No. 20887179.8, dated Nov. 8, 2023, 13 pages.

(Continued)

*Primary Examiner* — Chun Cao
(74) *Attorney, Agent, or Firm* — Morgan, Lewis & Bockius LLP

(57) ABSTRACT

Provided are an active heat dissipation apparatus for a terminal, a terminal, and an active heat dissipation method for a terminal, including: the heat source collection modules distributed at various positions of the terminal collect heat data at the various positions of the terminal; a calculation and simulation module inputs the heat data collected at the various positions to a preset simulation model to determine a heat dissipation solution; and a control module controls a heat dissipation module to dissipate heat for corresponding positions of the terminal according to the heat dissipation solution.

17 Claims, 6 Drawing Sheets

(58) Field of Classification Search
USPC .......................................................... 700/300
See application file for complete search history.

(56) References Cited

U.S. PATENT DOCUMENTS

2008/0306633 A1* 12/2008 Tunks ................ G05D 23/1919
              700/300
2013/0186596 A1   7/2013 Rubenstein et al.
2014/0054024 A1*  2/2014 Chen .................. H05K 7/20836
              417/44.1

FOREIGN PATENT DOCUMENTS

| CN | 104735248 A | 6/2015 |
| CN | 104955314 A | 9/2015 |
| CN | 105376378 A | 3/2016 |
| CN | 107168109 * | 9/2017 |
| CN | 107168109 A | 9/2017 |

OTHER PUBLICATIONS

International Search Report for Application No. PCT/CN2020/109482, dated Sep. 28, 2020, 4 pages including English translation.

* cited by examiner

ACTIVE HEAT DISSIPATING APPARATUS FOR A TERMINAL, TERMINAL, AND ACTIVE HEAT DISSIPATING METHOD FOR A TERMINAL

CROSS-REFERENCE TO RELATED APPLICATION(S)

This is a national stage application filed under 37 U.S.C. 371 based on International Patent Application No. PCT/CN2020/109482, filed Aug. 17, 2020, which claims priority to Chinese Patent Application No. 201911108748.2 filed Nov. 13, 2019, the disclosures of which are incorporated herein by reference in their entireties.

FIELD

Embodiments of the present disclosure, relate to but are not limited to, the technical field of terminal heat dissipation and, in particular, relate to but are not limited to, an active heat dissipation apparatus for a terminal, a terminal, and an active heat dissipation method for a terminal.

BACKGROUND

Mobile terminals are equipped with more and more functions currently. Taken a mobile phone as an example, a display screen thereof the mobile phone is getting larger and larger, a luminance and a pixel resolution thereof are getting higher and higher, a battery capacity thereof is getting larger and larger, a CPU clock speed of a processor thereof is getting higher and higher, and communication modes thereof are getting more and more, whereas an area of a motherboard thereof is getting smaller and smaller. Currently, when a mobile phone works in The 4th generation mobile communication technology (4G) and the 5th generation mobile communication technology (5G) simultaneously, its power consumption may be increased from several watts to tens of watts due to its small layout space. A long-time call, a long-time video communication, a long-time gaming, or a long-time high-speed uploading or downloading may cause a temperature on a liquid crystal display (LCD) surface or a back shell of the mobile phone to rise rapidly. As a result, a large amount of heat is unable to dissipate outside of the mobile but stuck inside the mobile phone, which may affect the user experience and even burn a user mildly.

The heat generated in a mobile terminal may affect the transmitting and receiving performance, deteriorate communication quality, and reduce the data throughput rate of uploading and downloading. Additionally, since the battery in an existing mobile phone is commonly a lithium battery composed of chemical liquids, overheating may cause a violent chemical reaction inside the lithium battery, thus resulting in the battery to be swelled, to be blistered, to be ruptured or even to be exploded. The heat generated in the mobile terminal may further affect the comfortability for a user to hold the mobile terminal or affect the comfortability for a user to attach his/her face to the mobile terminal, degrading the user experience. Accordingly, the heat dissipating performance of the mobile terminal is a crucial indicator for measuring the performance of the mobile terminal.

When a user plays a video, plays a game, or performs high-speed upload and download on a 5G terminal, in which 4G of multiple non-standalone Ad hocs (NSAs) and 5G may be operated simultaneously. Due to the multiple input multiple output (MIMO) and the multi-carrier aggregation in long term evolution (LTE) and new radio (NR), a power amplification module of uplink and downlink and a receiving module of uplink and downlink are operated in parallel, resulting in that a large amount of heat is aggregated in a short time and cannot be dissipated outside the terminal. For example, currently, LTE and SUB-6 GHz are each in a form of 4×4 MIMO. LTE often works in a carrier aggregation (CA) scenario of 3-7 CA. In a dual-connection mode of EUTRA-NR dual connectivity (ENDC), a situation of LTE B1 (4)_B3 (4)_B7 (4)_B28 (4)_N78 (4)_N41 (4) may exist. That is, four frequency bands of LTE and two frequency bands of NR may work simultaneously, and 4×4 MIMO works for each frequency band of LTE and for each frequency band of NR. In this way, the heat generated may be four to six times of the heat generated in a case where a single frequency band in traditional LTE works. The millimeter wave (MMW) is taken as another example, in which a terminal may have three or four MMW modules and each module has eight radio frequency units. That is, in an extreme case, eight PAs in a same module are all activated. 2×2 MIMO works for uplink, with 4 PAs for horizontal polarization and 4 PAs for vertical polarization. Moreover, MMW supports bandwidths of multiple carriers which varies from 1 carrier (CC) to 8 CC, up to 800 MHZ (i.e., 8 carriers may be aggregated together). In this service, a peak current exceeds 2A, which is more than 4 times of a peak current (500 mA) in a lower-speed service. According to tests, in a scene of high-speed service, a current of a 5G terminal is 3 to 4 times of that of a 4G terminal, and the amount of heat generated in a 5G terminal is more than one time of that generated in a 4G terminal. The amount of heat generated in a traditional 4G terminal may be around 42 degrees in general, while the amount of heat generated in a 5G terminal may often exceed 46 degrees and may reach up to 52 degrees in a high-speed service, which may lead to a risk of burning a human body mildly. Moreover, the amount of heat generated in a modem, a radio frequency power amplifier or the like inside a chip may reach up to 85 degrees, which leads to a rise of temperature rise, greatly deteriorating the throughput performance and radio frequency indicators. Thus, currently, the heat dissipation is a sore problem for a 5G terminal.

When a mobile phone is in operation, a plurality of heat sources exists, such as a baseband application processor (AP), a 4G/5G modem, a power conversion chip (DCDC), a power management chip with surrounding large capacitors and large inductors, a 4G/5G power amplifier, a wireless fidelity (WIFI) power chip, a WIFI power amplifier, an LCD driver chip, or an LCD screen. However, in the related art, either heat dissipation materials or heat dissipation measures are merely used to perform passive heat dissipation for partial of the phone, or, a fan is used to perform active heat dissipation within a small range. Traditional heat dissipations are all passive heat dissipations. The passive heat dissipation with heat dissipation materials has the problems of low energy efficiency, small workable range, and uncontrollability, while active heat dissipation with a fan involved needs an additional built-in small fan, which has the problems of loud noise and higher requirement for a structure space. Whether the heat of a 5G terminal can be dissipated actively, efficiently, and vastly without using a fan is a problem to be solved by the present disclosure and is as well a bottleneck restricting the development and application of 5G.

SUMMARY

Embodiments of the present disclosure provide an active heat dissipation apparatus for a terminal, a terminal, and an active heat dissipation method for a terminal to mainly solve a technical problem that currently, a mobile terminal is subject to a great pressure in heat dissipation, with the introduction of 5G functions.

To solve the preceding technical problem, embodiments of the present disclosure provide an active heat dissipation apparatus for a terminal, which includes heat source collection modules, a calculation and simulation module, a control module, and a heat dissipation module. The heat source collection modules are distributed at various positions of the terminal and are configured to collect heat data at the various positions of the terminal; the calculation and simulation module is configured to input the heat data collected by the heat source collection modules to a preset simulation model to determine a heat dissipation solution; and the control module is configured to control the heat dissipation module to dissipate heat for corresponding positions of the terminal according to the heat dissipation solution.

Embodiments of the present disclosure further provide a terminal, which includes a terminal operation component and the active heat dissipation apparatus for a terminal provided by embodiments of the present disclosure. The active heat dissipation apparatus for a terminal is disposed in the terminal operation component; and the terminal operation component and the active heat dissipation apparatus for a terminal integrally form the terminal.

Embodiments of the present disclosure provide an active heat dissipation method for a terminal. The active heat dissipation method for a terminal includes collecting heat data at various positions of the terminal by heat source collection modules distributed at the various positions of the terminal, inputting the heat data collected by the heat source collection modules to a preset simulation model to determine a heat dissipation solution, and controlling a heat dissipation module to dissipate heat for corresponding positions of the terminal according to the heat dissipation solution.

Embodiments of the present disclosure further provide a computer-readable storage medium. The computer-readable storage medium stores one or more programs which is executable by one or more processors to perform the preceding active heat dissipation method for a terminal.

According to the active heat dissipation apparatus for a terminal, the terminal, and the active heat dissipation method for a terminal provided by embodiments of the present disclosure, heat source collection modules are distributed at various positions of the terminal to collect heat data at the various positions of the terminal; a calculation and simulation module is configured to input the heat data collected at the positions to a preset simulation model to determine a heat dissipation solution; and a control module controls a heat dissipation module to dissipate heat for corresponding positions of the terminal according to the heat dissipation solution. In this way, heat sources at the positions of the terminal are monitored, based on the heat data at the positions of the terminal, an optimal heat dissipation solution is determined by using the simulation model to perform calculation, and the control module controls the heat dissipation module to dissipate heat for corresponding positions of the terminal according to the heat dissipation solution, therefore, the effect of adopting the optimal means of active heat dissipation, for different heat dissipation positions of the terminal and different heating situations, is achieved.

Other features of the present disclosure and corresponding beneficial effects are set forth later in the description, and it should be understood that at least part of the beneficial effects become apparent from the description of the present disclosure.

DETAILED DESCRIPTION

Figure 1:
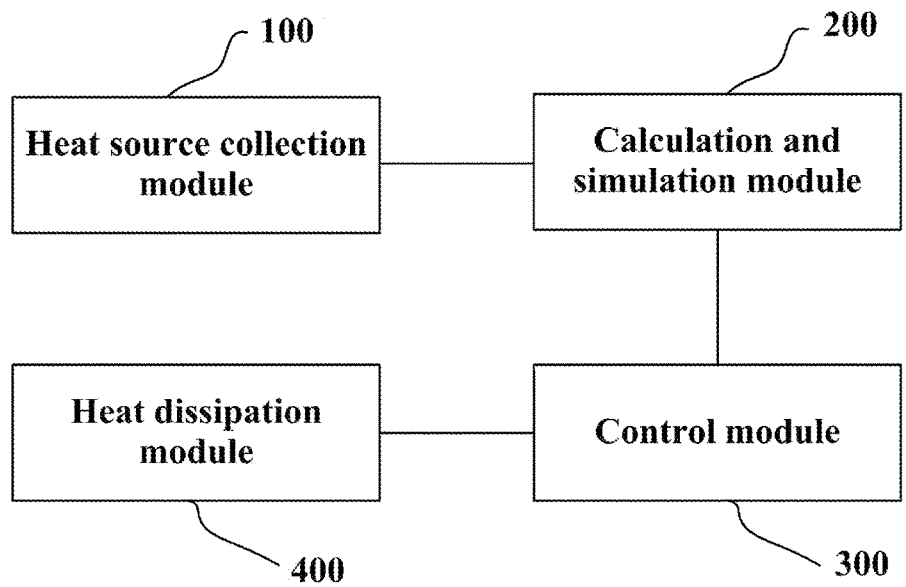
FIG. 1 is a schematic diagram of an active heat dissipation apparatus for a terminal according to embodiment one of the present disclosure.

In order for the object, solution and advantages of the present disclosure to be more apparent, embodiments of the present disclosure are further described hereinafter in detail in conjunction with implementations and tractions. It is to be understood that the embodiments described herein are merely intended to explain the present disclosure and not to limit the present disclosure.

In the related art, heat dissipation may be achieved by adopting the below solutions.

The heat dissipation may be achieved by adding an active heat dissipation fan or fin inside a shell of a terminal. However, in this solution, the structure of the shell is needed to change, relying heavily on transformations to components and structures and requiring a large internal space of the terminal.

The heat dissipation may be achieved by attaching a heat dissipation material or a thermally conductive copper tube to a chip or a battery of a terminal to achieve the object of heat dissipation and cooling. Common heat dissipation materials include thermally conductive graphite, thermally conductive silica gel, and phase change materials. However, in this solution, the heat dissipation effect is not good. Moreover, the thermally conductive materials are high in cost, while the phase change materials are uncontrollable in operating temperature and operating time, long in reversible time, and inconvenient for reuse in a short time.

The heat dissipation may be achieved by using a mobile software application (APP) such as "Clean Master" or "Ludashi" for cooling. In this solution, the cooling purpose is achieved by shutting up and freeing some memory in operation to release the memory space or by releasing an application that generates heat abnormally in the central processing unit (CPU). However, by this method, only the temperature of some software or partial components of the mobile terminal such as the CPU and the battery is reduced, or only the heat generated from CPU overloading caused by abnormal operation of some APPs can be dissipated effectively, thus practical cooling effect is not very effective.

The heat dissipation may also be achieved by reducing frequency, speed, or power with multiple cores operating alternately for cooling. In this solution, the heat dissipation is mainly achieved by reducing the number of CPUs of the mobile phone running at a same time or by reducing the maximum CPU clock speed of a chip directly. This solution relies in software modification too, which limits and reduces a current uplink and downlink rate of the terminal or limits a maximum transmission power of the terminal. Moreover, although dissipating heat, this solution affects the actual performance of the mobile phone and degrades the user experience.

Embodiment One

Traditional heat dissipation is mostly passive heat dissipation. A passive heat dissipation material has the problems of low energy efficiency, small workable range, and inevitable uncontrollability, while the fan-involved active heat dissipation needs an additional built-in small fan, resulting in loud noise and high requirement for the structure space.

To achieve a better heat dissipation effect, embodiments of the present disclosure provide an active heat dissipation apparatus for a terminal to overcome preceding problems and deficiencies. Under the premise of not using a fan, the active heat dissipation apparatus for a terminal can still dissipate heat for a 5G terminal adaptively, actively, efficiently, fast, and repeatedly.

This embodiment provides an active heat dissipation apparatus for a terminal. The active heat dissipation apparatus for a terminal includes heat source collection modules, a calculation and simulation module, a control module, and a heat dissipation module. The heat source collection modules are distributed at various positions of the terminal and are configured to collect heat data at the various position of the terminal; the calculation and simulation module is configured to input the heat data collected by the heat source collection modules to a preset simulation model to determine a heat dissipation solution; and the control module is configured to control the heat dissipation module to dissipate heat for corresponding positions of the terminal according to the heat dissipation solution.

Referring to FIG. 1, FIG. 1 is a schematic diagram of an active heat dissipation apparatus for a terminal according to embodiment one of the present disclosure. The active heat dissipation apparatus for a terminal includes heat source collection modules 100, a calculation and simulation module 200, a control module 300, and a heat dissipation module 400.

The heat source collection modules 100 are distributed at various positions of the terminal. The positions include, but are not limited to, the positions of parts that are easy to generate heat on the terminal or the positions of chips, for example, the position of a baseband chip, the position of a processor, the position of a charging chip, the back of an LED display panel, and the position of an LCD backlight. In the embodiment of the present disclosure, the heat source collection modules are composed of thermistors and are distributed at positions being main heat generation components of the terminal. The thermistors form a temperature detection loop through shunt capacitors. The temperature detection loop is connected to a temperature detection circuit of a power management (PM) chip through a multi-throw switch. The PM chip is configured to read the temperature data of each of the thermistors in real time.

The calculation and simulation module 200 is connected to the heat source collection modules 100 at various positions of the terminal and is connected to the control module 300. The calculation and simulation module is configured to input the heat data collected by the heat source collection modules to the preset simulation model to perform calculation to determine a cooling target, a cooling period, a running duration, a cooling mode, and a corresponding phase change module. The phase change module is a heat dissipation component in the heat dissipation module.

In the embodiment of the present disclosure, the calculation and simulation module 200 further includes an operation mode detection module configured to detect a current service type of the terminal to determine a current operation mode of the terminal. Different operation modes correspond to different model values for dissipating heat. The calculation and simulation module is configured to, in response to a user starting a service, call a heat model according to a corresponding operation mode.

In the embodiment of the present disclosure, the calculation and simulation module 200 further includes an application scene detection module configured to detect a current application scene of the terminal to determine a current scene mode of the terminal. The application scene includes any one of the following scenes: a calling mode, a charging mode, a gaming mode, a downloading mode, a video communicating mode, a photographing mode, or a high-speed uploading and downloading mode of throughout software or data in 2G/3G/4G/5G.

In the embodiment of the present disclosure, the control module 300 is connected to the calculation and simulation module 200 and the heat dissipation module 400. The control module is configured to control the heat dissipation module to dissipate heat for corresponding positions of the terminal according to the heat dissipation solution and is configured to determine a region not touched by the user in combination with a current holding state of a user, and control the heat to be conducted to the region not touched by the user.

In the embodiment of the present disclosure, the heat dissipation module 400 is a phase change module. The heat dissipation module 400 is configured to dissipate heat through a phase change of a material. The heat dissipation module 400 includes an active hot-melting heat dissipation module, a micro-vibration heat dissipation module, a remote heat dissipation module, a circular inversion module, and a passive phase change module. One end of the active hot-melting heat dissipation module, one end of the micro-vibration heat dissipation module, one end of the remote heat dissipation module, and one end of the circular inversion module are connected to the control module; and the other end of the active hot-melting heat dissipation module, the other end of the micro-vibration heat dissipation module, the other end of the remote heat dissipation module, and the other end of the circular inversion module are connected to the passive phase change module. The active hot-melting heat dissipation module is configured to dissipate heat fast based on temperature adjustment according to a fast-melting mechanism and conduct heat to a region not touched by a user to perform fixed-point heating. The micro-vibration heat dissipation module is configured to perform active control and adjustment of micro-vibration based on active cooling adjustment and control of the phase change material of a micro-vibration mechanism, to implement active heat absorption and active heat dissipation of a phase change module or a phase change material. The remote heat dissipation module is configured to conduct, based on a heat channeling mechanism and through a special channel, heat from heat sources affecting the user to a region of phase change material capable of dissipating heat actively, to dissipate and transfer heat. The circular inversion module is configured to perform fast inversion on a heat-absorbing material being phase-changed, to absorb and dissipate heat fast and circularly. The passive phase change module is configured to dissipate heat based on a passive phase change.

Embodiments of the present application provide an active heat dissipation apparatus for a terminal. The active heat dissipation apparatus for a terminal includes heat source collection modules, a calculation and simulation module, a control module, and a heat dissipation module. The heat source collection modules are distributed at various positions of the terminal and are configured to collect heat data at the various positions of the terminal; the calculation and simulation module is configured to input the heat data collected by the heat source collection modules to a preset simulation model to determine a heat dissipation solution; and the control module is configured to control the heat dissipation module to dissipate heat for corresponding positions of the terminal according to the heat dissipation solution. In this way, heat source monitoring at various positions of the terminal is implemented. Moreover, based on the heat data at the various positions of the terminal, the optimal heat dissipation solution is determined by using the simulation model to perform calculation. Finally, the arrangement in which the control module controls the heat dissipation module to dissipate heat for corresponding positions of the terminal according to the heat dissipation solution achieves the effect of adopting an optimal means of active heat dissipation for different heat generation positions of the terminal and different heating situations.

Embodiment Two

Figure 2:
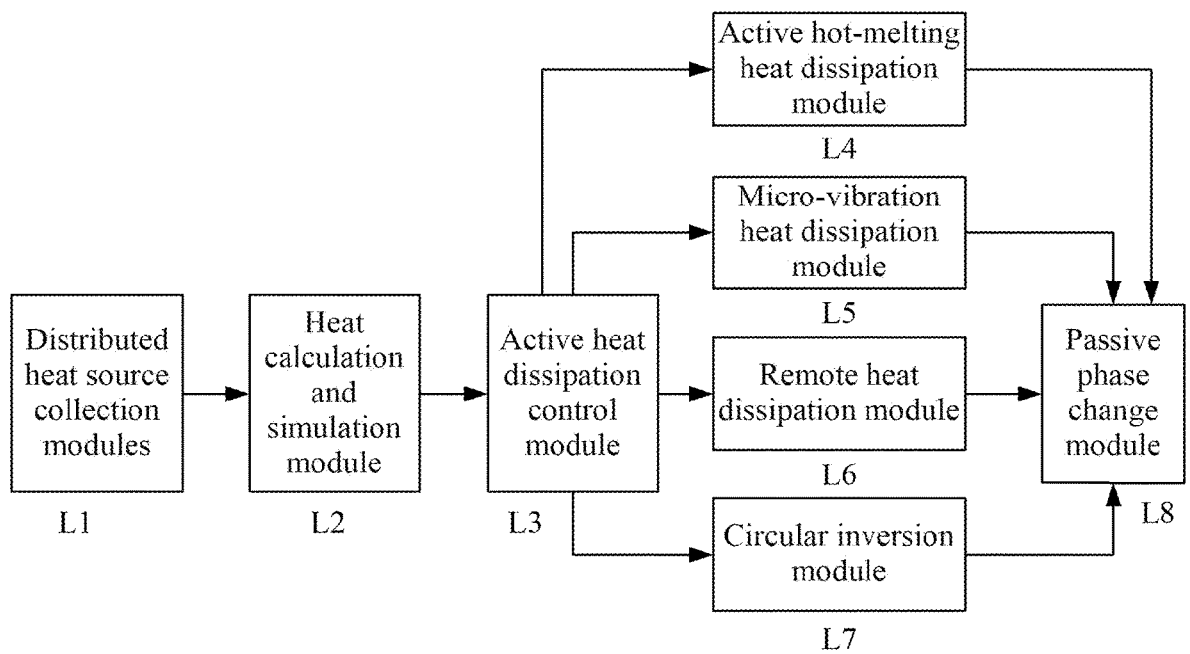
FIG. 2 is a detailed schematic diagram of an active heat dissipation apparatus for a terminal according to embodiment two of the present disclosure.

This embodiment provides a more detailed active heat dissipation apparatus for a terminal. The structure of the active heat dissipation apparatus for a terminal is shown in FIG. 2. In FIG. 2, distributed heat source collection modules are the heat source collection modules in embodiment one of the present disclosure. A heat calculation and simulation module is the calculation and simulation module in embodiment one of the present disclosure; an active heat dissipation control module is the control module in embodiment one of the present disclosure; and an active hot-melting heat dissipation module, a micro-vibration heat dissipation module, a remote heat dissipation module, a circular inversion module, and a passive phase change module jointly form the heat dissipation module in embodiment one of the present disclosure.

Referring to FIG. 2, the distributed heat source collection modules L1 are connected to the heat calculation and simulation module L2 and are configured to collect the highest temperature of various heat sources. The distributed heat source collection modules are composed of thermistor arrays disposed at various positions of the terminal. The thermistor arrays are distributed at various sensitive temperature-rising and heat-generating points, for example, a 4G or 5G baseband chip, a 4G or 5G modem, a power amplifier in each frequency band, a power management chip, a WIFI chip, a DCDC circuit, a battery, an LCD chip, a light-emitting diode (LED) indicator, a flash chip, an interior of front shell of the terminal or an interior of back shell of the terminal. Each thermistor forms a temperature detection loop through a shunt capacitor and is connected to a temperature detection circuit of a PM chip through a multi-throw switch. The PM chip may transmit the read real-time temperature values to the distributed heat source collection modules in sequence.

The heat calculation and simulation module L2 is connected to the distributed heat source collection modules L1 and the active heat dissipation control module L3 and is configured to perform heat calculation and simulation based on the current temperature collected by the distributed heat source collection modules L1 to determine a cooling target, a cooling period, a running duration, a cooling mode, and a corresponding phase change module so as to guarantee that a user would not feel hot obviously before completion of a service. The heat calculation and simulation module performs the first-stage heat calculation based on the collection of the current power current and temperature of the terminal, parameters of a heat-generating chip module, and parameters of a phase change and thermally conductive material. The first-stage heat calculation is on the basis of a built-in calculation formula model of the mobile phone. The heat conduction of a heat-generating module is calculated based on collection of, for example, a heat-generating area of a chip, a thickness of a thermally conductive base, a thermal conductivity coefficient, a power consumption of the chip, a length of a thermally conductive material, a current temperature, a target temperature and the like.

The heat calculation and simulation module is further configured to detect a current operation mode of the terminal, for example, data service or voice parameter configuration, LCD luminance setting, parameters of charging or not, parameters of transmission power, and conditions about whether wireless and cellular are started. For example, in a case where the download rate is 1000 Mbps and the upload rate is 200 Mbps, the operation mode is defined as M1. For example, in a case where the download rate is 800 Mbps and the upload rate is 200 Mbps, the operation mode is defined as M2. For example, in a case where the download rate is 600 Mbps and the upload rate is 200 Mbps, the operation mode is defined as M3. Each mode corresponds to a referenced model value MT1 for dissipating heat. These model values are stored in the simulation module. When the user starts some service, the heat model in a same scene is called. For example, the current mobile phone is in a maximum-throughput downloading scene with a maximum power in a case of 5G NR 4×4 MIMO. In this scene, the power consumption is 3 watts; the heat is 10 joules; the current temperature is 51 degrees; a target temperature is 42 degrees; a duration of downloading still needs to last for 5 minutes; the phase change module corresponding to the currently largest heat-generating point needs 2 minutes to complete the heat dissipation process; and the mobile phone is in a static downloading mode, matching an active heat dissipation mode, and the cooling time is 15S. In this case, related parameters may be transferred to an active heat dissipation control module for automatic control.

The heat calculation and simulation module may detect a current heat-generating application scene of the mobile phone so as to perform corresponding cooling and heat-dissipation processing based on different application scenes. The heat calculation and simulation module identifies a current scene mode with a maximum heat generation by monitoring a starting and using of each process in the mobile phone, including a calling mode, a charging mode, a gaming mode, a downloading mode, a video communicating mode, and a photographing mode. The scene may further be, for example, a scene of the high-speed uploading and downloading mode of throughout software or data in 2G/3G/4G/5G, a scene of surfing the Internet over charging the mobile phone or a scene of chatting over charging the mobile phone, and a scene of playing a game over charging the mobile phone. The preceding scene modes may be called through a baseband chip APP or acquired through a process. The application scene detection module transmits a detected result to an adaptive cooling control module so as to perform different cooling operations.

The active heat dissipation control module L3 is connected to the heat calculation and simulation module L3 and is connected to each of the control modules L4 to L7, and the active heat dissipation control module L3 is configured to perform corresponding active temperature adjustment and control based on a current application scene of the mobile phone and a heat source collection situation. For the control flow of the active heat dissipation control module L3, refer to the flowchart hereinafter. A value of the current application scene of the mobile phone is taken as input of this control module. Moreover, temperatures of sensitive heat sources in corresponding scenes are collected, so as to find out the highest temperatures of the heat-generating points. Then the control module, in combination with a current state of the user holding the mobile phone, selects a corresponding temperature control method and mode.

The active hot-melting heat dissipation module L4 is connected to the active heat dissipation control module L3 and a passive phase change module L8 and is configured to achieve the object of fast heat dissipation based on the temperature adjustment according to a fast-melting mechanism by performing fast fixed-point hot-melting control for a module capable of changing a phase at a point not touched by the user. A passive heat-dissipation phase change material in the terminal is placed or filled at a high temperature-generating point. When heat dissipation is needed, the control module receives a heat dissipation instruction and uses a thermal switch to conduct the highest heat-generating position of the terminal and the phase change module so that the passive heat-dissipation phase change material is fast melt in a very short time. In this way, the material undergoes a phase change immediately. The real-time temperature of the mobile phone is reduced through heat absorption in the phase change process.

The active hot-melting heat dissipation module may further perform fixed-point heating in a region not touched by the user. For example, a current heat-generating point for the user is in a region A, while the heating temperature of the region A is uncontrollable. Then a heat-generating element C is added to the hardware circuit in a region B. The region B is located in the region not touched by the user. The temperature of the heat-generating element in the region B is adjustable, with a specific temperature propositional to the current control current. Moreover, a phase change material is attached near to the region B, a changing process of the phase change material may be controlled through the heating of the heat-generating element C; that is, the change of the phase change material is controllable. One end of the phase change material is in the region B, and the other end is in the region A. In this way, the region A can be controlled through the region B, thus implementing the function of active hot-melting heat dissipation.

The micro-vibration heat dissipation module L5 is connected to the active heat dissipation control module L3 and the passive phase change module L8, and the micro-vibration heat dissipation module L5 is configured to control and adjust based on active cooling of a phase change material of a micro-vibration mechanism. The phase change module includes a phase change material for heat storage and energy absorption. During a vibration process of the phase change material, molecular collisions and morphological changes may occur in this material, to absorb external heat and reduce temperatures of partial of the terminal. Accordingly, a certain correspondence relationship is existed between heat absorption and speed, between heat absorption and vibration magnitude, and between heat absorption and time. Here the active heat absorption and dissipation of the phase change module or material are implemented through the active control and adjustment of micro-vibration.

A passive heat-dissipation phase change material in the terminal is built-in or filled at a high temperature-generating point. When heat dissipation is needed, the control module receives a micro-vibration instruction. The vibration may be a vibration caused by the user during operation or during playing game. When the temperature of the terminal reaches a trigger threshold of the phase change material, vibration may trigger the phase change material to undergo a phase change so as to reduce the real-time temperature of the mobile phone through heat absorption in the phase change process. This is a passive phase-change heat dissipation mechanism of vibration.

Here active phase-change heat dissipation is implemented through a micro-vibration apparatus. Micro-vibration is implemented through one or more linear or cylindrical motors built in the mobile phone. The motor would not vibrate obviously by modifying the rotation speed of the motor and modifying the instruction duration. The vibration frequency of the motor is adjustable and may be adjusted based on change of the phase change material. If the temperature of the mobile phone is excessively high and heat needs to be dissipated in a short time, the frequency magnitude may be adjusted to a value A. If the temperature of the mobile phone is not excessively high and heat needs to be dissipated slowly in a long time, the frequency magnitude may be adjusted to a value B.

In practice, the micro-vibration heat dissipation module may be triggered by the user normally clicking an icon or another virtual function key in a display region of a screen. Alternatively, the micro-vibration heat dissipation module may be triggered by, for example, a call from the user, a short message received by the user, or a WeChat prompt for updating. Alternatively, the micro-vibration heat dissipation module may be triggered by a feedback response from the user to a vibration during playing game. The operation of the preceding active heat dissipation apparatus is randomly triggered along with a traditional motor vibration, thus achieving a good heat dissipation effect and not having much effect on the use of the user. If it is detected that some positions of the mobile phone heat up obviously and affect the user experience, the user may also activate the micro-vibration heat dissipation module directly to perform active and continuous heat dissipation for a specific heat source close to the micro-vibration heat dissipation module.

The remote heat dissipation module L6 is connected to the active heat dissipation control module L3 and the passive phase change module L8 and is configured to perform channeling and transferring heat sources in a heat-generating position of the mobile phone. During the use of the mobile phone, different positions may have different heating temperatures. A heat-generating position may exist in a front shell of the mobile phone, in a back shell of the mobile phone, at top of the mobile phone, or at bottom of the mobile phone. In different application scenes, the user may touch or hold different positions of the mobile phone, thus having different feelings. Based on a heat channeling mechanism, the heat from heat sources affecting the use of the user is channeled through a special channel to a region of phase change material capable of dissipating heat actively so as to implement heat dissipation and transfer. Here, in a heat channeling module, thermocouple materials disposed on various key heat source chips or shielding covers are connected via PCB copper-exposed wires each with a certain width; and the conduction of each connection is controlled through a main control switch of the heat channeling module. When the user uses the terminal, the heat of the mobile phone is channeled away from a human hand or a human face by detecting a horizontal display mode or a vertical display mode of the LCD screen of the mobile phone and by detecting a proximity sensor signal during a call. Accordingly, an indirect cooling effect for the user is achieved.

The circular inversion module L7 is connected to the active heat dissipation control module L3 and the passive phase change module L8 and is configured to perform fast inversion for a heat-absorbing material being phase-changed to implement fast circular heat absorption and dissipation. After the first phase-change heat absorption occurs in the terminal, the mobile phone needs to stand by for a long time so that a phase change material releases heat stored to external environment and solidifies slowly before performing heat absorption for a next time. Such self-cooling and conversion process may be quite long, ranging from half an hour to one hour. If the user plays a game continuously or watches a video continuously, continuous phase-change cooling cannot be performed and the inversion process would be quite slow, thus failing to meet the user's needs.

The circular inversion module utilizes a thermally conductive path and a thermally conductive switch built-in the mobile phone. The phase change module after heat absorption and saturation is conducted by the thermally conductive switch to a magnesium-aluminum alloy or a LCD surface where the user would not feel being heated. The thermally conductive switch is activated only in response to that the phase-changed module is detected to be saturated; moreover, the thermally conductive switch is preferred to be activated in a case where the current application scene is detected to be the standby mode.

If the current scene of the user is in a continuous data service, in a continuous video communicating, or in continuous gaming, a micromotor heat dissipation module may also be started so that a specific phase change module is motor-driven to dissipate heat. After receiving an inversion instruction, the micromotor runs at high speed in a short time and generates a directional wind, and the directional wind is communicated to a specific phase change module through a directional channel, to perform fast cooling and heat dissipation.

The passive phase change module is connected to the active hot-melting heat dissipation module L4, the micro-vibration heat dissipation module L5, and the remote heat dissipation module L6, cooperates with the active control module, and is configured to perform active cooling and heat dissipation for the heating generated in the mobile phone. A phase change material is a type of material that may provide latent heat by changing its physical form. In the phase change process of melting, the phase change material can play the function of heat absorption and cooling, or play the function of heat release and warming. With the capability of heat storage, the phase change material thus can control the temperature of the terminal device. The process of changing physical properties of the phase change material is referred to as phase change. Specifically, when ambient temperature rises to a certain threshold, the phase change module or material may absorb thermal load and get molten. By contrast, when the ambient temperature lowers to a certain threshold, the phase change module or material is frozen and releases a certain amount of heat. The phase change module can change its form along with the change of temperature. When the temperature reaches a certain threshold, the phase change material softens or changes from a solid state to a liquid state so as to be attached to or to flow in gaps between elements and structures. The phase change module may be made of inorganic materials, such as crystalline hydrated salts, molten salts, metals, or alloys. Alternatively, the phase change module may be made of organic materials, such as paraffin wax or acetic acid. Alternatively, the phase change module may be made of composite materials. Here, A phase change material with high latent heat of melting, good reversibility of a phase change, thin volume, and large thermal conductivity coefficient is selected as a material of the phase change module. For example, a metal or alloy material, with the advantages of high thermal conductivity, small thermal resistance, good repeatability, and high heat storage and dissipation, is suitable for the hardware system of the mobile phone.

A phase-change temperature range of the phase change module is required to meet a heating temperature range of the mobile phone. When the mobile phone operates with a heavy load, a limit temperature of the mobile phone may reach up to 45 degrees to 55 degrees. Generally speaking, a safe sensible temperature of a human body is below 42 degrees. When the sensible temperature exceeds 42 degrees, it may cause discomfort and may even cause a mild burn when the user uses the mobile phone for a long time. Accordingly, the temperature range of a phase change should be selected within the range of, for example, not exceeding 42 degrees. When the temperature of partial of the mobile phone exceeds this threshold, the phase change process may be controlled to be activated. The phase change module or material is added between a chip and a shielding cover, or between a shielding cover and a magnesium-aluminum alloy structural member. The phase change material undergoes a phase change when the heating temperature is in the range of 42 degrees to 45 degrees. After triggering the phase change of the phase change module between a heat source and a structural member, the phase change module absorbs heat and forms a better thermally conductive interface. When a phase change material in the terminal undergoes a positive phase change from a solid state to a liquid state, a phase change module absorbs and stores a large amount of latent heat during melting so as to reduce the temperature of the terminal. By contrast, when the phase change module in the terminal is cooled and undergoes an inverse phase change from a liquid state to a solid state, the stored heat is dissipated into the environment within a certain temperature range. In these two processes, the temperature change of the phase change module is very small and may be ignored, while the heat it absorbs or releases is of a large amount; that is, the phase change module can dissipate heat for the heat-generating terminal.

Embodiment Three

Embodiments of the present disclosure provide an active heat dissipation method for a terminal. The active heat dissipation method for a terminal includes collecting heat data at various positions of the terminal by heat source collection modules distributed at the various positions of the terminal, inputting the heat data to a preset simulation model to determine a heat dissipation solution, and controlling a heat dissipation module to dissipate heat for corresponding positions of the terminal according to the heat dissipation solution.

Figure 3:
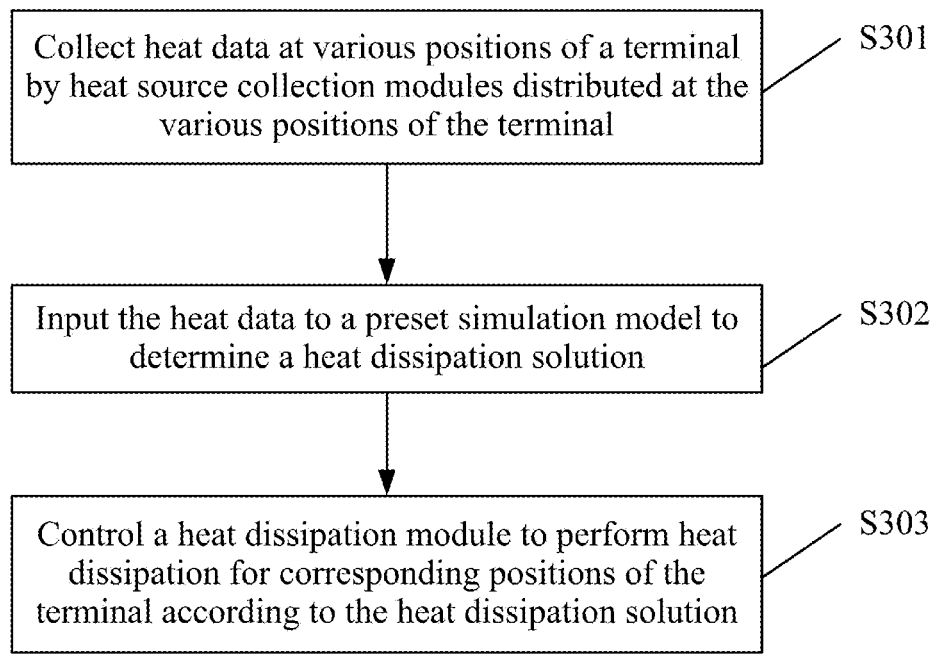
FIG. 3 is a flowchart of an active heat dissipation method for a terminal according to embodiment three of the present disclosure.

Referring to FIG. 3, FIG. 3 is a flowchart of an active heat dissipation method for a terminal according to embodiment three of the present disclosure. The active heat dissipation method for a terminal includes the following.

In S301, heat data at various positions of the terminal is collected by heat source collection modules distributed at the various positions of the terminal.

In S302, the heat data is inputted to a preset simulation model to determine a heat dissipation solution.

In S303, a heat dissipation module is controlled to dissipate heat for corresponding positions of the terminal according to the heat dissipation solution.

In the embodiment of the present disclosure, S302 in which the heat data is inputted to the preset simulation model to determine the heat dissipation solution includes inputting the heat data collected by the heat source collection modules to the preset simulation model to perform calculation to determine a cooling target, a cooling period, a running duration, a cooling mode, and a corresponding phase change module. The phase change module is a heat dissipation component in the heat dissipation module.

In the embodiment of the present disclosure, the active heat dissipation method for a terminal further includes detecting a current service type of the terminal to determine a current operation mode of the terminal. Different operation modes correspond to different model values for dissipating heat. The calculation and simulation module is configured to, in response to a user starting a service, call a heat model according to a corresponding operation mode.

In the embodiment of the present disclosure, the active heat dissipation method for a terminal further includes detecting a current application scene of the terminal to determine a current scene mode of the terminal. The application scene includes any one of the following scenes: a calling mode, a charging mode, a gaming mode, a downloading mode, a video communicating mode, a photographing mode, or the high-speed uploading and downloading mode of throughout software or data in 2G/3G/4G/5G.

In the embodiment of the present disclosure, S303 in which the heat dissipation module is controlled to dissipate heat for corresponding positions of the terminal according to the heat dissipation solution further includes determining, in combination with a current holding state of a user, and channeling the heat to a region not touched by the user.

In the embodiment of the present disclosure, S303 in which the heat dissipation module is controlled to dissipate heat for corresponding positions of the terminal according to the heat dissipation solution further includes at least one of that an active hot-melting heat dissipation module dissipates heat fast based on a temperature adjustment according to a fast-melting mechanism and channels heat to a region not touched by the user to perform fixed-point heating, that a micro-vibration heat dissipation module implements the active heat absorption and dissipation of a phase change module or material based on the active cooling adjustment and control of the phase change material of a micro-vibration mechanism through the active control and adjustment of micro-vibration, that a remote heat dissipation module implements heat dissipation and transfer by channeling, based on a heat channeling mechanism and through a special channel, heat from heat sources affecting the use of the user to a region of phase change material capable of dissipating heat actively, that a circular inversion module implements circular heat absorption and dissipation by performing fast inversion for a heat-absorbing material being phase-changed, and that a passive phase change module dissipates the heat based on a passive phase change.

The embodiment provides an active heat dissipation method for a terminal. The active heat dissipation method for a terminal includes collecting heat data at various positions of the terminal by heat source collection modules distributed at the various positions of the terminal, inputting the heat data to a preset simulation model to determine a heat dissipation solution, and controlling a heat dissipation module to dissipate heat for corresponding positions of the terminal according to the heat dissipation solution. In the active heat dissipation method for a terminal in the embodiment of the present disclosure, the heat data at the various positions of the terminal is detected and then inputted to the preset simulation model to determine the heat dissipation solution; then heat dissipation is performed for corresponding positions of the terminal according to the heat dissipation solution. In this way, the terminal adopts the optimal heat dissipation solution for heat dissipation, enabling the heat dissipation effect to be maximized.

Embodiment Four

Figure 4:
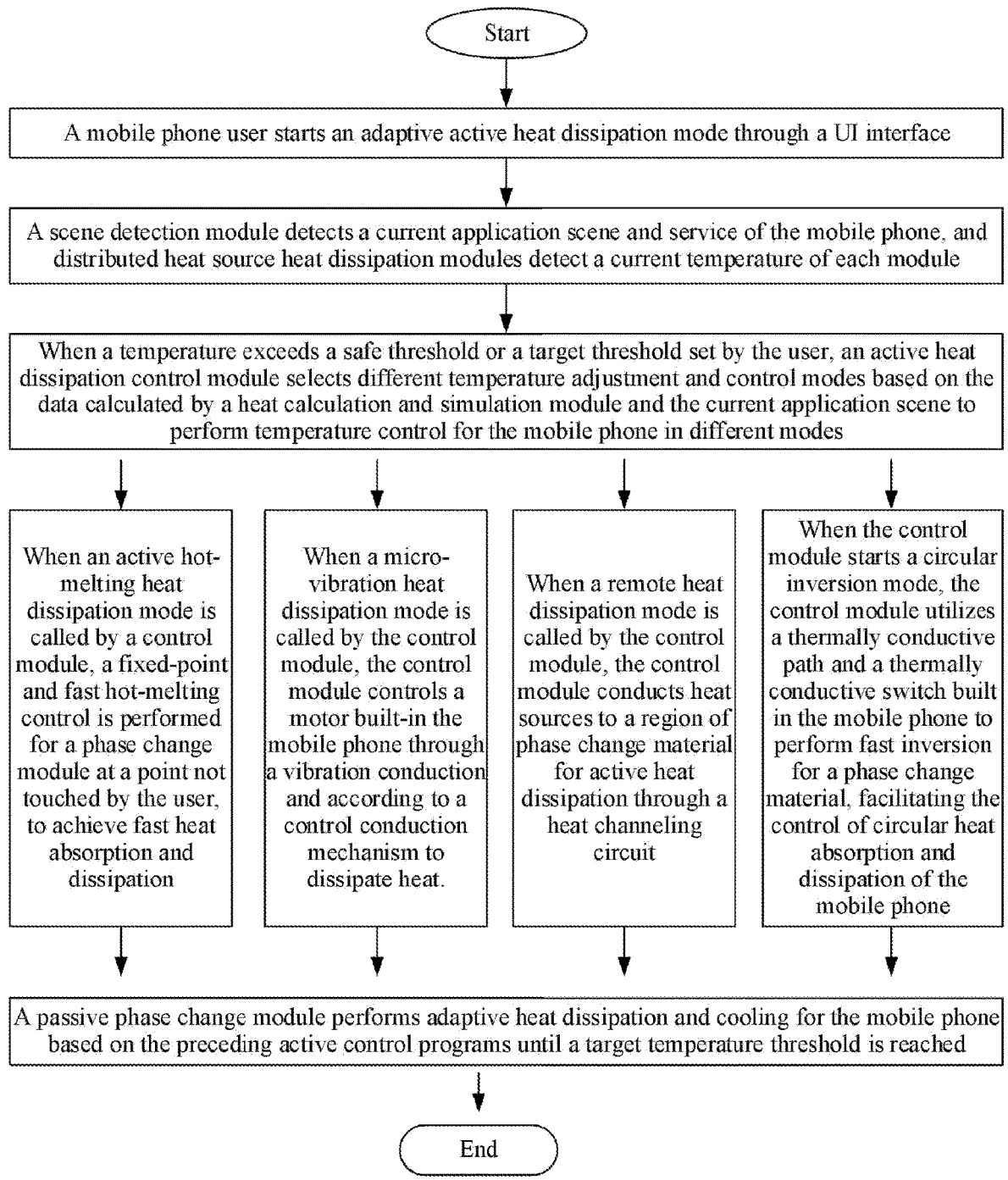
FIG. 4 is a detailed flowchart of an active heat dissipation method for a terminal according to embodiment four of the present disclosure.

The embodiment provides a flowchart of an active heat dissipation method for a terminal, as shown in FIG. 4. In FIG. 4, the active heat dissipation method for a terminal includes the following.

Firstly, a terminal user starts an adaptive active heat dissipation mode through a user interface (UI) interface.

Secondly, a scene detection module detects the current application scene and service of the mobile phone; and distributed heat dissipation modules of heat sources detect a current temperature of each module.

Thirdly, when a temperature exceeds a safe threshold or a target threshold set by a user, an active heat dissipation control module selects different temperature adjustment and control modes based on data calculated by a heat calculation and simulation module and based on current application scene, to perform temperature control for the terminal in different modes.

Fourthly, (1) when an active hot-melting heat dissipation mode is called by a control module, a fixed-point and fast hot-melting control is performed for a phase change module at a region not touched by the user, to achieve fast heat absorption and dissipation.

(2) When a micro-vibration heat dissipation mode is called by the control module, the control module controls a motor built-in the terminal through a vibration conduction and dissipates heat according to a control conduction mechanism.

(3) when a remote heat dissipation mode is called by the control module, the control module conducts heat sources to a region of phase change material for active heat dissipation through a heat channeling circuit.

(4) when the control module starts a circular inversion mode, the control module utilizes a thermally conductive path and a thermally conductive switch built in the mobile phone to perform fast inversion for a phase change material, facilitating the control of circular heat absorption and dissipation of the terminal.

It is to be understood that one of the preceding heat dissipation modes described above may be performed alone or multiple heat dissipation modes thereof may be performed together.

Fifthly, a passive phase change module performs adaptive heat dissipation and cooling for the mobile phone based on the preceding active control programs until a target temperature threshold is reached.

Embodiment Five

Figure 5:
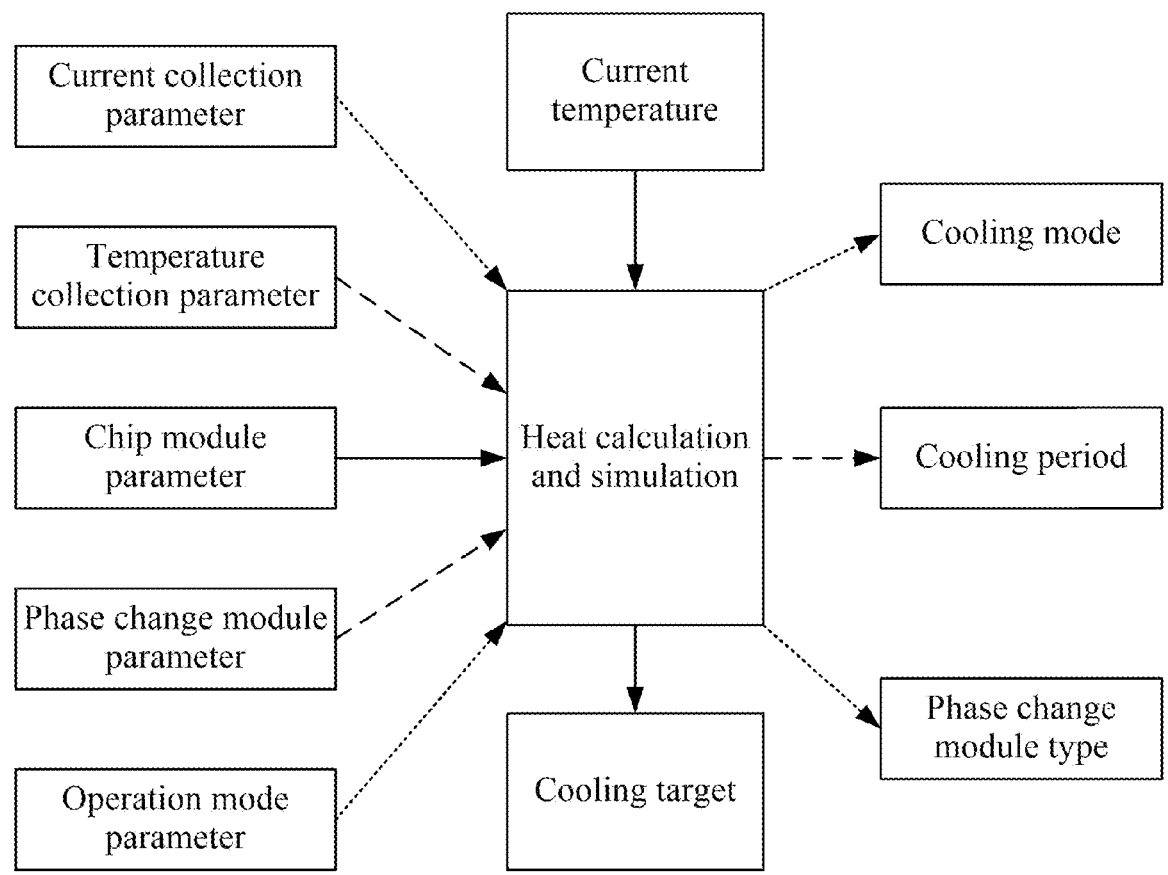
FIG. 5 is an example illustrating heat calculation and simulation built in a mobile phone according to embodiment five of the present disclosure.

The embodiment is an example illustrating the heat calculation and simulation built in a mobile phone. Referring to FIG. 5, when a user plays a high-definition video, a power amplifier (PA) may continuously heat up due to high-speed data transmission and the continuous keeping-on of the LCD. The temperature of a corresponding region is 51 degrees, while the target temperature to be cooled to is 42 degrees; accordingly, a temperature difference needing to be cooldown is 9 degrees. The mobile phone collects a corresponding operating current of the mobile phone, a peripheral temperature of a chip, calls heat model parameters for the chip, phase changing modules and parameters of other thermally conductive materials, imports them into a model formula, and calculates a corresponding heat storage. Based on a target cooling temperature, an optimal cooling mode, cooling period, and a type of corresponding phase change module are selected. For example, in a scenario where a power consumption is 3 watts, an amount of heat is 10 joules, a current temperature is 51 degrees, a target temperature is 42 degrees, a play is expected to last for 15 minutes; currently, the phase change module corresponding to the highest heat-generating point needs 2 minutes to complete the heat dissipation process; the mobile phone is in a static downloading mode, which corresponds to an active hot-melting heat dissipation mode; and a thermal equilibrium and a target temperature may be achieved through heat dissipation for 15S. In this case, related parameters may be transferred to an active heat dissipation control module for automatic control.

Embodiment Six

Figure 6:
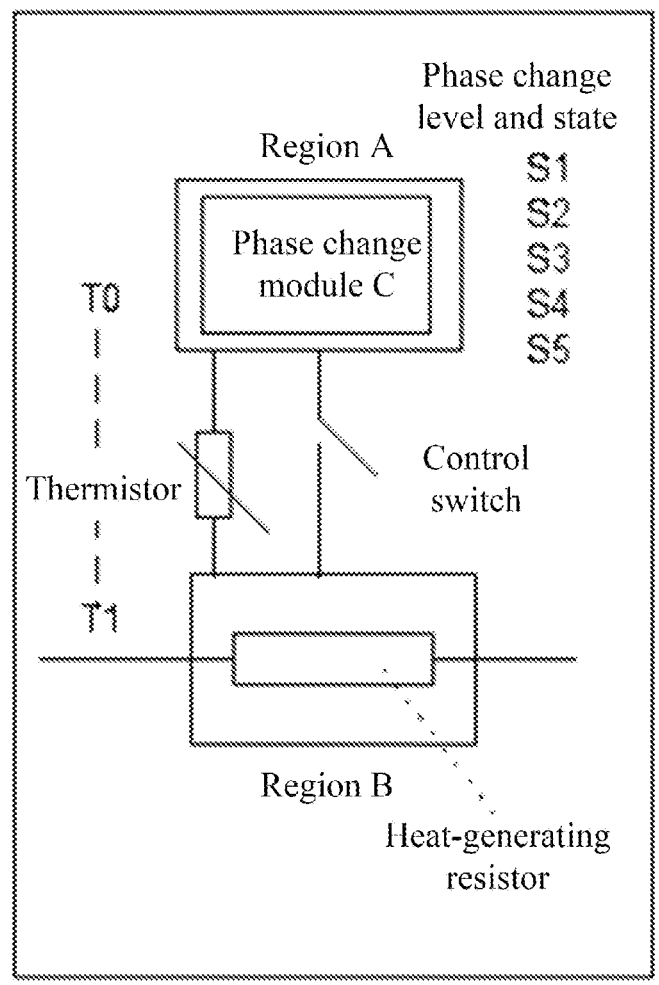
FIG. 6 is an example of an active hot-melting heat dissipation mode according to embodiment six of the present disclosure.

The embodiment is taken an active hot-melting heat dissipation mode as an example. Referring to FIG. 6, melting states and processes of a phase change material are controlled by performing fixed-point heat compensation and temperature control in a region not touched by a user. For example, the melting states of the phase change material are defined as S1, S2, S3, S4, and S5, which are totally 5 levels; and heat absorption capacities thereof follows S5>S4>S3>S2>S1. When a heat-generating region of the terminal is in different temperature ranges T1, T2, T3, and T4, it corresponds to different melting states.

For example, a current heat-generating point for a user is in a region A and the region A greatly affects the handholding experience of the user, as either the heating temperature in the region A or the phase change process and phase change states of a phase change material in the region A is uncontrollable, a heat-generating element and a heat-sensitive element are added to a hardware circuit in a region B located in a region not touched by the user. The temperature of the heat-generating element at the region B is adjustable, with a specific temperature propositional to a current operation current. Moreover, a phase change material is attached near to the region B. The phase change material attached may control its melting states of phase changing to be in S1, S2, S3, S4 or S5 through the heating of the heat-generating element. That is, the change of the phase change material is controllable. One end of the phase change material is in the region B, and the other end of the phase change material is in the region A. In this way, the region A can be controlled through the region B, thus implementing the function of active hot-melting heat dissipation.

Embodiment Seven

Figure 7:
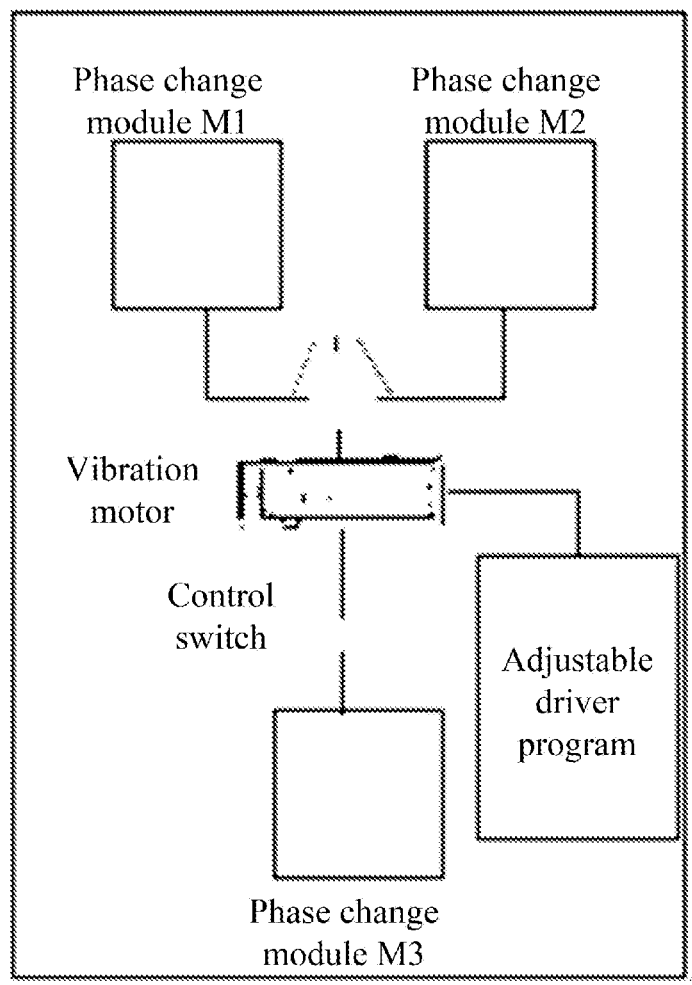
FIG. 7 is an example of a micro-vibration heat dissipation mode according to embodiment seven of the present disclosure.

The embodiment takes a micro-vibration heat dissipation mode as an example. Referring to FIG. 7, 1 to N micro-vibration apparatuses are built in a terminal for implementing active phase-change heat dissipation. Micro-vibration is implemented through one or more linear or cylindrical motors built in the mobile phone. If the terminal has only one motor, a plurality of phase change modules M1 to M5 may be controlled by combining the one motor with a single-pole multi-throw switch. The terminal would not be obviously vibrated by modifying the rotation speed of the one motor and modifying a specified rotation duration of the one motor. The vibration frequency A1 to A5 of the motor may be adjusted based on phase changing states S1 to S5 of the phase change material. If the temperature of the mobile phone is excessively high and heat needs to be dissipated fast in a short time, the frequency magnitude may be adjusted to a value F1. If the temperature of the mobile phone is not excessively high and heat needs to be dissipated slowly over a long time, the frequency magnitude may be adjusted to a value F2. The micro-vibration heat dissipation mode is especially suitable for a game with a vibration mode or a tactile feedback scene.

Embodiment Eight

Figure 8:
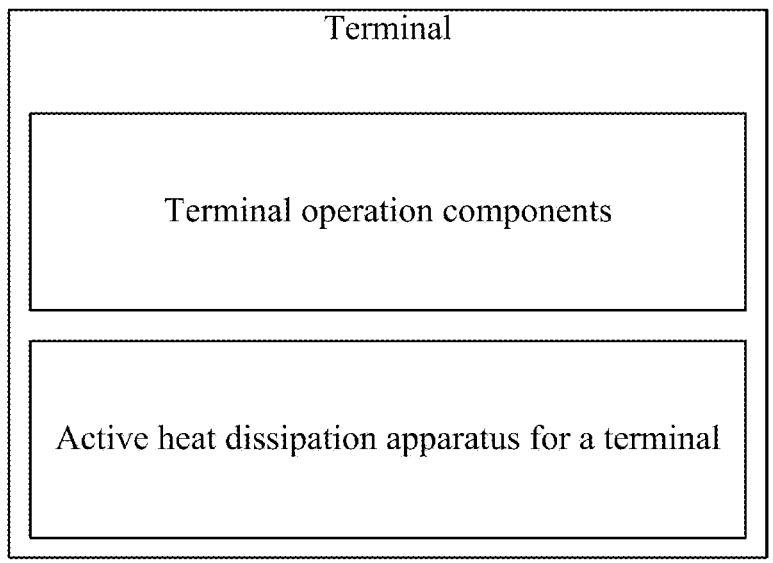
FIG. 8 is a schematic diagram of a terminal according to embodiment eight of the present disclosure.

The embodiment provides a terminal. Referring to FIG. 8, the terminal includes terminal operation components and the active heat dissipation apparatus for a terminal provided by embodiments of the present disclosure. The active heat dissipation apparatus for a terminal is disposed in the terminal operation components; and the terminal operation components and the active heat dissipation apparatus for a terminal integrally form the terminal.

The terminal operation components may generate heat during operation. The active heat dissipation apparatus for a terminal is disposed in the terminal operation components to detect the temperature of each terminal operation component and to control and adjust each terminal operation component individually to dissipate heat.

The embodiment provides a computer-readable storage medium. The computer-readable storage medium includes a volatile or non-volatile medium, a removable or non-removable medium or a transitory or non-transitory medium implemented in any method or technology for storing information (such as computer-readable instructions, data structures, computer program modules, or other data). The computer-readable storage medium includes, but is not limited to, a random-access memory (RAM), a read-only memory (ROM), an electrically erasable programmable read-only memory (EEPROM), a flash memory, or other memory technologies, a compact disc read-only memory (CD-ROM), a digital versatile disc (DVD) or another optical disc storage, a magnetic cassette, a magnetic tape, disk storage or another magnetic storage apparatus, or any other medium that may be used for storing desired information and accessed by a computer.

The computer-readable storage medium in the embodiment of the present disclosure, stores one or more computer programs executable by one or more processors, and the one or more computer programs, when executed by the one or more processors, cause the one or more processors to perform the active heat dissipation method for a terminal provided by embodiments of the present disclosure.

It can be seen that it is to be understood by those skilled in the art that some or all of the preceding method and function modules/units in the preceding system or apparatus may be implemented as software (which may be implemented by computer program codes executable by a computing device), firmware, hardware and suitable combinations thereof. In the hardware implementation, the division of the preceding function modules/units may not correspond to the division of physical components. For example, one physical component may have multiple functions, one function may be performed jointly by several physical components. Some or all physical components may be implemented as software executed by a processor such as a central processing unit, a digital signal processor or a microprocessor, may be implemented as hardware, or may be implemented as integrated circuits such as application-specific integrated circuits.

Additionally, as is known to those having ordinary skill in the art, communication media generally include computer-readable instructions, data structures, computer program modules, or other data in carriers or in modulated data signals transported in other transport mechanisms and may include any information delivery medium. Therefore, the present disclosure is not limited to any particular combination of hardware and software.

The preceding content is a more detailed description of embodiments of the present disclosure in conjunction with implementations and is not to be construed as limiting embodiments of the present disclosure. For those having ordinary skill in the art to which the present disclosure pertains, simple deductions or substitutions may be made without departing from the concept of the present disclosure and are considered to fall within the scope of the present disclosure.

What is claimed is:

1. An active heat dissipation apparatus for a terminal, comprising heat source collectors, a simulator, a controller, and a heat dissipator, wherein
the heat source collectors are distributed at various positions of the terminal and are configured to collect heat data at the various positions of the terminal;
the simulator is configured to input the heat data collected by the heat source collectors to a preset simulation model to determine a heat dissipation solution; and
the controller is configured to control the heat dissipator to dissipate heat for corresponding positions of the terminal according to the heat dissipation solution; and
wherein the simulator is connected to the heat source collectors and the controller; and
the simulator is configured to input the heat data collected by the heat source collectors to the preset simulation model to perform calculation to determine a cooling target, a cooling period, a running duration, a cooling mode, and to determine a corresponding phase change module, wherein the phase change module is a heat dissipation component in the heat dissipator.

2. The active heat dissipation apparatus for a terminal according to claim 1, wherein the heat source collectors are composed of thermistors and are distributed at positions being main heat generation components of the terminal, and the thermistors form a temperature detection loop through shunt capacitors; and
the temperature detection loop is connected to a temperature detection circuit of a power management (PM) chip through a multi-throw switch, and the PM chip is configured to read temperature data of each of the thermistors in real time.

3. The active heat dissipation apparatus for a terminal according to claim 1, wherein the simulator further comprises an operation mode detection module, the operation mode detection module is configured to detect a current service type of the terminal to determine a current operation mode of the terminal;
wherein different operation modes correspond to different model values for dissipating heat; and the simulator is configured to, in response to a user starting a service, call a heat model according to a corresponding operation mode of the different operation modes.

4. The active heat dissipation apparatus for a terminal according to claim 1, wherein the simulator further comprises an application scene detection module, and the application scene detection module is configured to detect a current application scene of the terminal to determine a current scene mode of the terminal, wherein
the application scene comprises any one of the following scene modes: a call scene mode, a charging scene mode, a gaming scene mode, a downloading scene mode, a video communicating scene mode, a photographing scene mode, or a high-speed throughout software or data uploading and downloading scene mode for throughout software or data in 2G/3G/4G/5G.

5. The active heat dissipation apparatus for a terminal according to claim 1, wherein the controller is connected to the simulator and the heat dissipator; and
the controller is configured to control the heat dissipator dissipate heat for the corresponding positions of the terminal according to the heat dissipation solution and is configured to determine a region not touched by a user according to a current holding state of the user, and control heat to be channeled to the region not touched by the user.

6. The active heat dissipation apparatus for a terminal according to claim 1, wherein the heat dissipator is a phase change heat dissipator to dissipate heat through a phase change material, and the heat dissipator comprises an active hot-melting heat dissipator, a micro-vibration heat dissipator, a remote heat dissipator, a circular inverter, and a passive phase change heat dissipator, wherein
one end of the active hot-melting heat dissipator, one end of the micro-vibration heat dissipator, one end of the remote heat dissipator, and one end of the circular inverter are connected to the controller; and another end of the active hot-melting heat dissipator, another end of the micro-vibration heat dissipator, another end of the remote heat dissipator, and another end of the circular inverter are connected to the passive phase change heat dissipator;
the active hot-melting heat dissipator is configured to dissipate heat based on temperature adjustment according to a fast-melting mechanism and conduct the heat to a region not touched by a user to perform fixed-point heating;
the micro-vibration heat dissipator is configured to perform active control and adjustment of micro-vibration based on active cooling adjustment and control of the phase change material of a micro-vibration mechanism, to implement active heat absorption and active heat dissipation of a phase change module or the phase change material;
the remote heat dissipator is configured to conduct, based on a heat channeling mechanism and through a special channel, heat from heat sources affecting the user to a region of the phase change material capable of dissipating heat actively, to dissipate and transfer heat;

the circular inverter is configured to perform fast inversion on a heat-absorbing material being phase-changed, to absorb and dissipate heat circularly; and the passive phase change heat dissipator is configured to dissipate heat based on a passive phase change.

7. A terminal, comprising terminal operation components and an active heat dissipation apparatus for a terminal, wherein the active heat dissipation apparatus for a terminal is disposed in the terminal operation components, and the terminal operation components and the active heat dissipation apparatus for a terminal integrally form the terminal;

wherein the active heat dissipation apparatus for a terminal comprises heat source collectors, a simulator, a controller, and a heat dissipator, and wherein the heat source collectors are distributed at various positions of the terminal and are configured to collect heat data at the various positions of the terminal;

the simulator is configured to input the heat data collected by the heat source collectors to a preset simulation model to determine a heat dissipation solution; and the controller is configured to control the heat dissipator to dissipate heat for corresponding positions of the terminal according to the heat dissipation solution; and wherein the simulator is connected to the heat source collectors and the controller; and the simulator is configured to input the heat data collected by the heat source collectors to the preset simulation model to perform calculation to determine a cooling target, a cooling period, a running duration, a cooling mode, and to determine a corresponding phase change module, wherein the phase change module is a heat dissipation component in the heat dissipator.

8. The terminal according to claim 7, wherein the heat source collectors are composed of thermistors and are distributed at positions being main heat generation components of the terminal, and the thermistors form a temperature detection loop through shunt capacitors; and the temperature detection loop is connected to a temperature detection circuit of a power management (PM) chip through a multi-throw switch, and the PM chip is configured to read temperature data of each of the thermistors in real time.

9. The terminal according to claim 7, wherein the simulator further comprises an operation mode detection module, the operation mode detection module is configured to detect a current service type of the terminal to determine a current operation mode of the terminal;

wherein different operation modes correspond to different model values for dissipating heat; and the simulator is configured to, in response to a user starting a service, call a heat model according to a corresponding operation mode of the different operation modes.

10. The terminal according to claim 7, wherein the simulator further comprises an application scene detection module, and the application scene detection module is configured to detect a current application scene of the terminal to determine a current scene mode of the terminal, wherein the application scene comprises any one of the following scene modes: a call scene mode, a charging scene mode, a gaming scene mode, a downloading scene mode, a video communicating scene mode, a photographing scene mode, or a high-speed throughout software or data uploading and downloading scene mode for throughout software or data in 2G/3G/4G/5G.

11. The terminal according to claim 7, wherein the controller is connected to the simulator and the heat dissipator; and the controller is configured to control the heat dissipator dissipate heat for the corresponding positions of the terminal according to the heat dissipation solution and is configured to determine a region not touched by a user according to a current holding state of the user, and control heat to be channeled to the region not touched by the user.

12. An active heat dissipation method for a terminal, comprising:

collecting heat data at various positions of the terminal by heat source collectors distributed at the various positions of the terminal;

inputting the heat data collected by the heat source collectors to a preset simulation model to determine a heat dissipation solution; and controlling a heat dissipator to dissipate heat for corresponding positions of the terminal according to the heat dissipation solution;

wherein inputting the heat data collected by the heat source collectors to the preset simulation model to determine the heat dissipation solution, comprises:

inputting the heat data collected by the heat source collectors to the preset simulation model to perform calculation to determine a cooling target, a cooling period, a running duration, a cooling mode, and to determine a corresponding phase change module, wherein the phase change module is a heat dissipation component in the heat dissipator.

13. The active heat dissipation method for a terminal according to claim 12, further comprising:

detecting a current service type of the terminal to determine a current operation mode of the terminal, wherein different operation modes correspond to different model values for dissipating heat; and in response to a user starting a service, a heat model is called according to a corresponding operation mode of the different operation modes.

14. The active heat dissipation method for a terminal according to claim 12, further comprising:

detecting a current application scene of the terminal to determine a current scene mode of the terminal, wherein the application scene comprises any one of the following scenes: a calling mode, a charging mode, a gaming mode, a downloading mode, a video communicating mode, a photographing mode, or a high-speed uploading and downloading mode of throughout software or data in 2G/3G/4G/5G.

15. The active heat dissipation method for a terminal according to claim 12, wherein controlling the heat dissipator to dissipate heat for the corresponding positions of the terminal according to the heat dissipation solution further comprises determining, in combination with a current holding state of a user, a region not touched by the user, and controlling heat to be channeled to the region not touched by the user.

16. The active heat dissipation method for a terminal according to claim 12, wherein controlling the heat dissipator to dissipate heat for the corresponding positions of the terminal according to the heat dissipation solution, comprises at least one of:

by an active hot-melting heat dissipator, dissipating heat based on temperature adjustment according to a fast-melting mechanism and conducting heat to a region not touched by a user to perform fixed-point heating;

by a micro-vibration heat dissipator, performing active control and adjustment of micro-vibration based on active cooling adjustment and control of a phase change material of a micro-vibration mechanism, to implement active heat absorption and active heat dissipation of a phase change module or the phase change material;

by a remote heat dissipator, conducting, based on a heat channeling mechanism and through a special channel, heat from heat sources affecting the user to a region of phase change material capable of dissipating heat actively, to dissipate and transfer heat;

by a circular inverter, performing fast inversion on a heat-absorbing material being phase-changed, to absorb and dissipate heat circularly; or, by a passive phase change heat dissipator, dissipating heat based on a passive phase change.

17. A non-transitory computer-readable storage medium storing one or more programs, wherein the one or more programs is executable by one or more processors, and the one or more programs, when executed by the one or more processors, cause the one or more processors to perform the active heat dissipation method for a terminal according to claim 12.

* * * * *